(12) United States Patent
Winters

(10) Patent No.: US 9,391,661 B2
(45) Date of Patent: Jul. 12, 2016

(54) HIGHER EFFICIENCY CARBON NANOTUBE ANTENNA

(71) Applicant: Jack Winters, Middletown, NJ (US)

(72) Inventor: Jack Winters, Middletown, NJ (US)

( * ) Notice: Subject to any disclaimer, the term of this patent is extended or adjusted under 35 U.S.C. 154(b) by 0 days.

(21) Appl. No.: 14/510,096

(22) Filed: Oct. 8, 2014

(65) Prior Publication Data

US 2015/0099479 A1    Apr. 9, 2015

Related U.S. Application Data

(60) Provisional application No. 61/888,180, filed on Oct. 8, 2013.

(51) Int. Cl.
   *H04B 1/04*    (2006.01)
   *H04B 1/16*    (2006.01)

(52) U.S. Cl.
   CPC ............... *H04B 1/1607* (2013.01); *H04B 1/04* (2013.01); *H04B 2001/0408* (2013.01)

(58) Field of Classification Search
   CPC ............ H04B 1/0458; H04B 1/03; H04B 2001/0408; H04B 1/04; H04B 1/1607; H04B 2100/045; H04B 2100/0245; H04B 17/00; H04W 52/0245; B60N 2/002; H01Q 1/36; H01Q 23/00; H01L 31/052; H01L 31/0543; G06F 17/00; H04L 25/08
   See application file for complete search history.

(56) References Cited

U.S. PATENT DOCUMENTS

| | | | | |
|---|---|---|---|---|
| 2007/0285843 A1* | 12/2007 | Tran | ............. | B82Y 10/00 360/245.9 |
| 2009/0160728 A1* | 6/2009 | Emrick | ............. | H01Q 1/36 343/893 |
| 2012/0028680 A1* | 2/2012 | Breed | ............. | B60N 2/002 455/556.1 |
| 2012/0235869 A1* | 9/2012 | Allen | ............. | B82Y 10/00 343/720 |
| 2013/0157729 A1* | 6/2013 | Tabe | ............. | H04W 52/0245 455/573 |
| 2014/0293529 A1* | 10/2014 | Nair | ............. | H01Q 23/00 361/679.31 |
| 2016/0027949 A1* | 1/2016 | Cooke | ............. | H01L 31/052 136/246 |

\* cited by examiner

*Primary Examiner* — Thanh Le
(74) *Attorney, Agent, or Firm* — Porzio, Bromberg & Newman, P.C.

(57) ABSTRACT

A signal transmitter includes a carbon nanotube antenna and a heat to electricity conversion device, which powers an amplifier in the transmitter. The heat from the inefficiency of the antenna is conducted to the heat to electricity conversion device. Additional heat from the transmitter electronics and any other inefficient processes can also be conducted to the heat to electricity conversion device. In this manner, the overall efficiency of the carbon nanotube antenna can be substantially increased.

5 Claims, 1 Drawing Sheet

HIGHER EFFICIENCY CARBON NANOTUBE ANTENNA

BACKGROUND OF THE INVENTION

1. Field of the Invention

The present invention relates to carbon nanotube antennas and in particular to higher efficiency carbon nanotube antennas.

2. Description of Related Art

Carbon nanotubes have useful properties as antennas for wireless communications. Specifically, these antennas have a wave velocity that is only 1% of that free space, which means that their physical length is only 1% of that of a metal antenna of the same size in wavelengths. For example, a half wavelength dipole antenna at 900 MHz is only 1.7 mm for a carbon nanotube antenna versus 17 cm for a metal antenna. Thus, in the same physical area the carbon nanotube antenna can have 10,000 times more antennas and one million times more antennas in the same volume. The implementation of large numbers of antennas in a small device is becoming increasingly important as the complexity of multiple-input-multiple-output technology increases in wireless systems.

Carbon nanotubes also have other useful properties over metal such as 1) a current density that is much greater, e.g., 1000 times greater than copper, 2) strength that is much greater, e.g., 100 times stronger than steel by weight, and 3) thermal conductivity that is greater than diamond, e.g., 10 times that of copper. Furthermore, as these carbon nanotube antennas consist of rolled-up graphene sheets, graphene electronics can be easily connected to these antennas.

However, carbon nanotube antennas have very low efficiency compared to metal antennas at typical wireless communication frequencies around 1 GHz, e.g., single walled carbon nanotube (SWCNT) antennas can have efficiencies of 1/1,000,000 or −60 dB. Thus, there can be as much as a 60 dB loss between the power sent to the antenna and the power transmitted, which is power lost as heat, which greatly limits the usefulness of these antennas, even when taking into consideration the reduction in size. This problem is known, with one conventional solution proposed that involves the use of bundles of SWCNT antennas, which increases the efficiency by 30-40 dB, although at an increase in antenna size, but the efficiency is still very low.

SUMMARY OF THE INVENTION

To overcome the low efficiency, the present invention uses heat generated by the inefficient antenna radiation to generate power for additional radiation. The high thermal conductivity of the carbon nanotube antennas means that much of this heat can be transferred to a heat to electricity producing device, e.g., a thermocouple, which is then converted to electricity which can then be used to power the transmitter which contains an amplifier. Even if the heat to electricity producing device is not highly efficient in its conversion, the high thermal conductivity of the graphene (carbon nanotubes) can be used to transfer much of this heat, also including any heat from the electronics, including the transmitter electronics which could include not just the amplifier, but also graphene, carbon nanotubes, and carbon nanotube transistors, to this or another heat to electricity producing device to further increase the overall efficiency. Thus, although the carbon nanotube antenna or arrays of these antennas may have a low efficiency, the overall system including both the antennas and the heat to electricity producing device or devices can be much more efficient, allowing for practical implementation of carbon nanotube antennas in wireless communication systems.

The invention will be more fully described by reference to the following drawings.

DETAILED DESCRIPTION

Reference will now be made in greater detail to preferred embodiments of the invention, examples of which are illustrated in the accompanying drawings.

Figure 1:
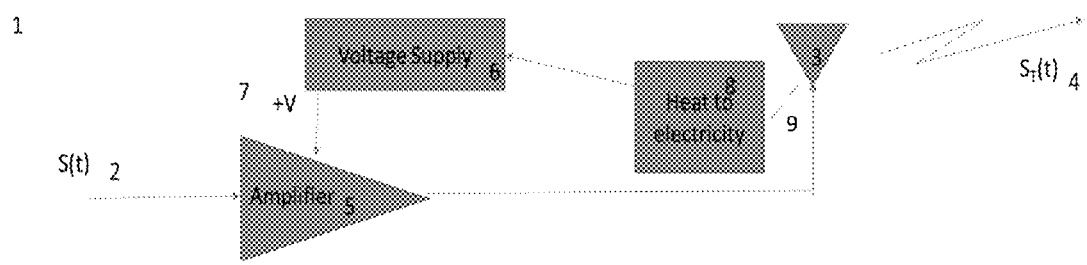
FIG. 1 shows a preferred embodiment, where the heat from a carbon nanotube antenna is converted to electricity to power the signal amplifier for the antenna.

FIG. 1 shows a preferred embodiment, where the heat from a carbon nanotube antenna is converted to electricity to power the signal amplifier for the antenna.

Specifically, signal transmitter 1 transmits input signal 2, S(t), from carbon nanotube antenna 3 as signal 4, $S_T(t)$. The input signal 2 is amplified to amplifier 5, which is powered by power supply 6 with output voltage +V 7. Power supply 6 in turn receives some of its power from electricity generated by heat to electricity conversion device 8. The heat input to device 8 comes from the carbon nanotube antenna which has high thermal conductivity, and therefore much of the heat from the antenna, due to the fact that the antenna is not 100% efficient, is available for use by the heat to electricity conversion device 8 through connection 9. Device 8 may be a thermocouple.

Although thermocouples can be used, they have relatively low efficiency in converting heat to electricity, typically less than 10%. Alternatively, thermionic generators can be used for heat to electricity conversion device 8. For example, the thermionic generators can have efficiencies of 40%. Alternatively, other heat to conversion devices 8 can be used with efficiencies that can approach 90%. Furthermore, because of the high thermal conductivity of graphene, heat can be efficiently transferred to the heat to conversion device also from the electronics of the amplifier 5 or antenna 3, including any graphene electronics, with graphene enclosures also used to transfer heat to the heat to electricity conversion device 8, as shown in FIG. 2.

Figure 2:
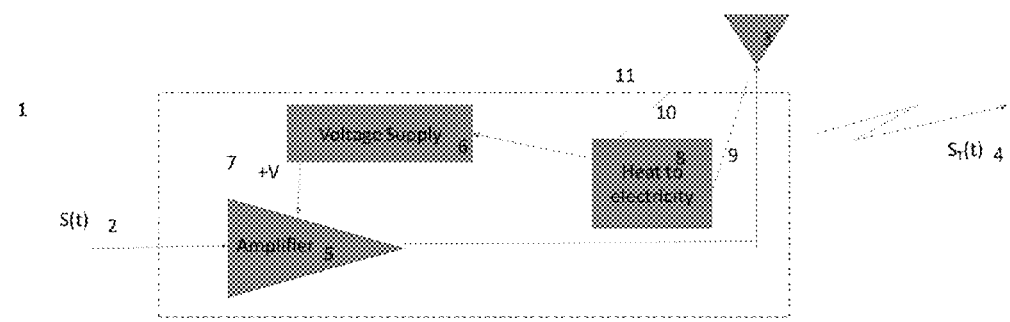
FIG. 2 shows a second embodiment of a transmitter where heat from carbon nanotube antenna is converted to electricity to power the transmitter amplifier, and the electronics are surrounded by a carbon nanotube enclosure.

In FIG. 2, a graphene enclosure 11 surrounds the electronics, including the power supply 6, amplifier 5, and heat to electricity conversion device 8. The heat to electricity device 8 is attached to both the antenna via connect 9 and the enclosure via connection 10 for transfer of heat to the heat to electricity conversion device 8.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A signal transmitter comprising a carbon nanotube antenna, a heat to electricity conversion device, and transmitter electronics containing an amplifier, wherein the amplifier is powered by the heat to electricity conversion device, and heat supplied to the heat to conversion device is conducted from the antenna.

2. The signal transmitter of claim 1 wherein the heat to electricity conversion device is a thermocouple.

3. The signal transmitter of claim 1 wherein the heat to electricity conversion device is a thermionic generator.

4. The signal transmitter of claim 1 further comprising graphene electronics of the amplifier or the antenna to transfer heat to the heat to electricity conversion device.

5. The signal transmitter of claim 1 further comprising a graphene enclosure surrounding at least part of the transmitter electronics connected to the heat to electricity conversion device.

\* \* \* \* \*